United States Patent
Lo et al.

(10) Patent No.: US 12,336,332 B2
(45) Date of Patent: Jun. 17, 2025

(54) MICRO LIGHT EMITTING DIODE AND MICRO LIGHT-EMITTING DIODE DISPLAY PANEL

(71) Applicant: PlayNitride Display Co., Ltd., MiaoLi County (TW)

(72) Inventors: Yu-Yun Lo, MiaoLi County (TW); Bo-Wei Wu, MiaoLi County (TW); Shih-Yao Liang, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 494 days.

(21) Appl. No.: 17/898,409

(22) Filed: Aug. 29, 2022

(65) Prior Publication Data

US 2023/0261137 A1    Aug. 17, 2023

(30) Foreign Application Priority Data

Feb. 17, 2022   (TW) .................. 111105756

(51) Int. Cl.
| | |
|---|---|
| *H10H 20/821* | (2025.01) |
| *H01L 25/075* | (2006.01) |
| *H10H 20/816* | (2025.01) |
| *H10H 20/831* | (2025.01) |
| *H10H 20/84* | (2025.01) |

(52) U.S. Cl.
CPC ....... *H10H 20/821* (2025.01); *H01L 25/0753* (2013.01); *H10H 20/816* (2025.01); *H10H 20/8314* (2025.01); *H10H 20/84* (2025.01)

(58) Field of Classification Search
CPC .. H10H 20/821; H10H 20/8314; H10H 20/84; H01L 25/0753
See application file for complete search history.

(56) References Cited

U.S. PATENT DOCUMENTS

| | | |
|---|---|---|
| 2006/0011946 A1 | 1/2006 | Toda et al. |
| 2021/0313499 A1* | 10/2021 | Gasse ............... H10F 30/21 |
| 2022/0384516 A1* | 12/2022 | Tan .................. H01L 25/18 |
| 2023/0074920 A1* | 3/2023 | Zhang .............. H10H 20/825 |

FOREIGN PATENT DOCUMENTS

| | | |
|---|---|---|
| CN | 110957399 | 4/2020 |
| TW | 201203603 | 1/2012 |
| TW | I746293 | 11/2021 |

OTHER PUBLICATIONS

"Office Action of Taiwan Counterpart Application", issued on Feb. 21, 2023, p. 1-p. 12.

* cited by examiner

*Primary Examiner* — Mark W Tornow
(74) *Attorney, Agent, or Firm* — JCIPRNET

(57) ABSTRACT

A micro light-emitting diode includes an epitaxial structure and an insulating layer. The epitaxial structure includes a first type semiconductor layer, a light-emitting layer, and a second type semiconductor layer, and has a first ion implantation region. A first distance is present between a surface of the first type semiconductor layer and a top surface of the light-emitting layer adjacent to the surface. A second distance is present between the surface of the first type semiconductor layer and a first bottom side of the first ion implantation region. The second distance is greater than the first distance and less than a height of a mesa. A first included angle having an absolute value between 0 and 15 degrees is present between a first extension direction of a first inner side of the first ion implantation region and a normal direction of the light-emitting layer.

15 Claims, 5 Drawing Sheets

MICRO LIGHT EMITTING DIODE AND MICRO LIGHT-EMITTING DIODE DISPLAY PANEL

CROSS-REFERENCE TO RELATED APPLICATION

This application claims the priority benefit of Taiwanese application no. 111105756, filed on Feb. 17, 2022. The entirety of the above-mentioned patent application is hereby incorporated by reference herein and made a part of this specification.

BACKGROUND

Technical Field

The disclosure relates to a light emitting structure, and particularly to a micro light-emitting diode and a micro light-emitting diode display panel using the micro light-emitting diode.

Description of Related Art

A light-emitting element, such as a light-emitting diode (LED), may emit light by an electron current driving a light-emitting layer of the LED. At the current stage, the LED still faces many technical challenges, and one of them is an efficiency droop effect of the LED. Specifically, when the light-emitting diode is driven within an operating range of current density, it corresponds to a peak value of the external quantum efficiency (EQE). As the current density of the LED continues to increase, the EQE may decrease. This phenomenon is the efficiency droop effect of the LED.

Currently, during manufacturing a micro light-emitting diode (micro LED), an etching process is adopted for procedures such as mesa and isolation. However, during the etching process, a sidewall of the micro LED may be damaged, affecting the micro LED to generate non-radiative recombination during light emission, resulting in a substantial decrease in the (EQE). When the size of the micro LED is less than 50 micrometers (μm), the proportion of carriers flowing through the sidewall increases as the surface area of the sidewall accounts for an increasing proportion of the overall surface area of the epitaxial structure, thus resulting in a substantial decrease in the EQE.

SUMMARY

The disclosure provides a micro light-emitting diode and a micro light-emitting diode display panel, which increases the external quantum efficiency and has better luminous efficiency.

According to an embodiment of the disclosure, a micro light-emitting diode includes an epitaxial structure and an insulating layer. The epitaxial structure includes a first type semiconductor layer, a light-emitting layer, and a second type semiconductor layer, and has a first ion implantation region. The light-emitting layer is located between the first type semiconductor layer and the second type semiconductor layer. The first type semiconductor layer, the light-emitting layer, and a first portion of the second type semiconductor layer constitute a mesa. A second portion of the second type semiconductor layer forms a concavity relative to the mesa. The first ion implantation region has a first inner side and a first bottom side connected to the first inner side. A first distance is present between a surface of the first type semiconductor layer and a top surface of the light-emitting layer adjacent to the surface. A second distance is present between the surface of the first type semiconductor layer and the first bottom side of the first ion implantation region. The second distance is greater than the first distance and less than a height of the mesa. A first included angle is present between a first extension direction of the first inner side of the first ion implantation region and a normal direction of the light-emitting layer. An absolute value of the first included angle is between 0 degree and 15 degrees. The insulating layer is disposed on the epitaxial structure and covers a periphery of the first type semiconductor layer and part of the surface, a periphery of the light-emitting layer, and part of a periphery of the second type semiconductor layer.

In an embodiment of the disclosure, the insulating layer is in contact with and covers a sidewall of the mesa. The mesa is closely adjacent to the second portion.

In an embodiment of the disclosure, the micro light-emitting diode further includes a current distribution layer. The current distribution layer is disposed between the insulating layer and the first type semiconductor layer. An orthographic projection of the current distribution layer on the surface of the first type semiconductor layer is smaller than the surface.

In an embodiment of the disclosure, a material of the current distribution layer includes indium tin oxide, indium oxide, tin oxide, aluminum zinc oxide, cadmium tin oxide, antimony tin oxide, zinc oxide, or a combination thereof.

In an embodiment of the disclosure, the micro light-emitting diode further includes a first electrode and a second electrode. The first electrode is electrically connected to the first type semiconductor layer. The second electrode electrically connected to the second type semiconductor layer. The first electrode and part of the second electrode are located on a same plane.

In an embodiment of the disclosure, the micro light-emitting diode further includes a current distribution layer. The current distribution layer is disposed between the insulating layer and the first type semiconductor layer. An orthographic projection of the current distribution layer on the surface of the first type semiconductor layer is smaller than the surface. The insulating layer has a first opening and a second opening. The first opening exposes the current distribution layer, and the second opening exposes the second portion of the second type semiconductor layer. The first opening is located at the mesa, and the second opening is located at the concavity. The first electrode is disposed in the first opening and extends onto the insulating layer, and the second electrode is disposed on the insulating layer and extends into the second opening.

In an embodiment of the disclosure, the first bottom side of the first ion implantation region is located in the first portion of the second type semiconductor layer. The first ion implantation region surrounds the periphery of the first type semiconductor layer, the periphery of the light-emitting layer, and part of a periphery of the first portion.

In an embodiment of the disclosure, the absolute value of the first included angle is between 7 degrees and 15 degrees.

In an embodiment of the disclosure, the epitaxial structure further has a second ion implantation region. The second ion implantation region has a second inner side and a second bottom side connected to the second inner side. A third distance is present between the surface of the first type semiconductor layer and the second bottom side of the second ion implantation region. The third distance is less than the first distance.

In an embodiment of the disclosure, the second bottom side of the second ion implantation region is located in the first type semiconductor layer and surrounds part of the periphery of the first type semiconductor layer. A second included angle is present between a second extension direction of the second inner side of the second ion implantation region and the normal direction of the light-emitting layer. An absolute value of the second included angle is greater than the absolute value of the first included angle.

In an embodiment of the disclosure, an ion concentration of the second ion implantation region is greater than an ion concentration of the first ion implantation region.

In an embodiment of the disclosure, the first bottom side of the first ion implantation region is located in the light-emitting layer. The first ion implantation region surrounds the periphery of the first type semiconductor layer and the periphery of the light-emitting layer.

In an embodiment of the disclosure, the periphery of the light-emitting layer is in direct contact with the insulating layer.

According to an embodiment of the disclosure, a micro light-emitting diode display panel includes a substrate and a plurality of micro light-emitting diodes. The substrate has a controlling element. The micro light-emitting diodes are arranged into an array on the substrate to form a plurality of pixels and are electrically connected to the controlling element. The controlling element respectively controls the micro light-emitting diodes to emit light. Each of the micro light-emitting diodes includes an epitaxial structure and an insulating layer. The epitaxial structure includes a first type semiconductor layer, a light-emitting layer, and a second type semiconductor layer, and has a first ion implantation region. The light-emitting layer is located between the first type semiconductor layer and the second type semiconductor layer. The first type semiconductor layer, the light-emitting layer, and a first portion of the second type semiconductor layer constitute a mesa. A second portion of the second type semiconductor layer forms a concavity relative to the mesa. The first ion implantation region has a first inner side and a first bottom side connected to the first inner side. A first distance is present between a surface of the first type semiconductor layer and a top surface of the light-emitting layer adjacent to the surface. A second distance is present between the surface of the first type semiconductor layer and the first bottom side of the first ion implantation region. The second distance is greater than the first distance and less than a height of the mesa. A first included angle is present between a first extension direction of the first inner side of the first ion implantation region and a normal direction of the light-emitting layer. An absolute value of the first included angle is between 0 degree and 15 degrees. The insulating layer is disposed on the epitaxial structure and covers a periphery of the first type semiconductor layer and part of the surface, a periphery of the light-emitting layer, and part of a periphery of the second type semiconductor layer.

In an embodiment of the disclosure, the micro light-emitting diodes include a red micro light-emitting diode emitting red light, a green micro light-emitting diode emitting green light, and a blue micro light-emitting diode emitting blue light.

Based on the foregoing, in the design of the micro light-emitting diode of the disclosure, the epitaxial structure has the first ion implantation region. The second distance between the surface of the first type semiconductor layer and the first bottom side of the first ion implantation region is greater than the first distance between the surface of the first type semiconductor layer and the top surface of the light-emitting layer adjacent to the surface and less than the height of the mesa. In addition, the first included angle having an absolute value between 0 degree and 15 degrees is present between the first extension direction of the first inner side of the first ion implantation region and the normal direction of the light-emitting layer. In other words, in the disclosure, the depth of the first ion implantation region exceeds the depth of the light-emitting layer, and the absolute value of the implantation angle of the first ion implantation region is between 0 degree and 15 degrees. This design reduces a substantial decrease in the external quantum efficiency caused by non-radiative recombination at the sidewall of the micro light-emitting diode, increases the external quantum efficiency, and effectively improves the dangling bond on the sidewall caused by dry etching, thus increasing the luminous efficiency of the micro light-emitting diode of the disclosure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
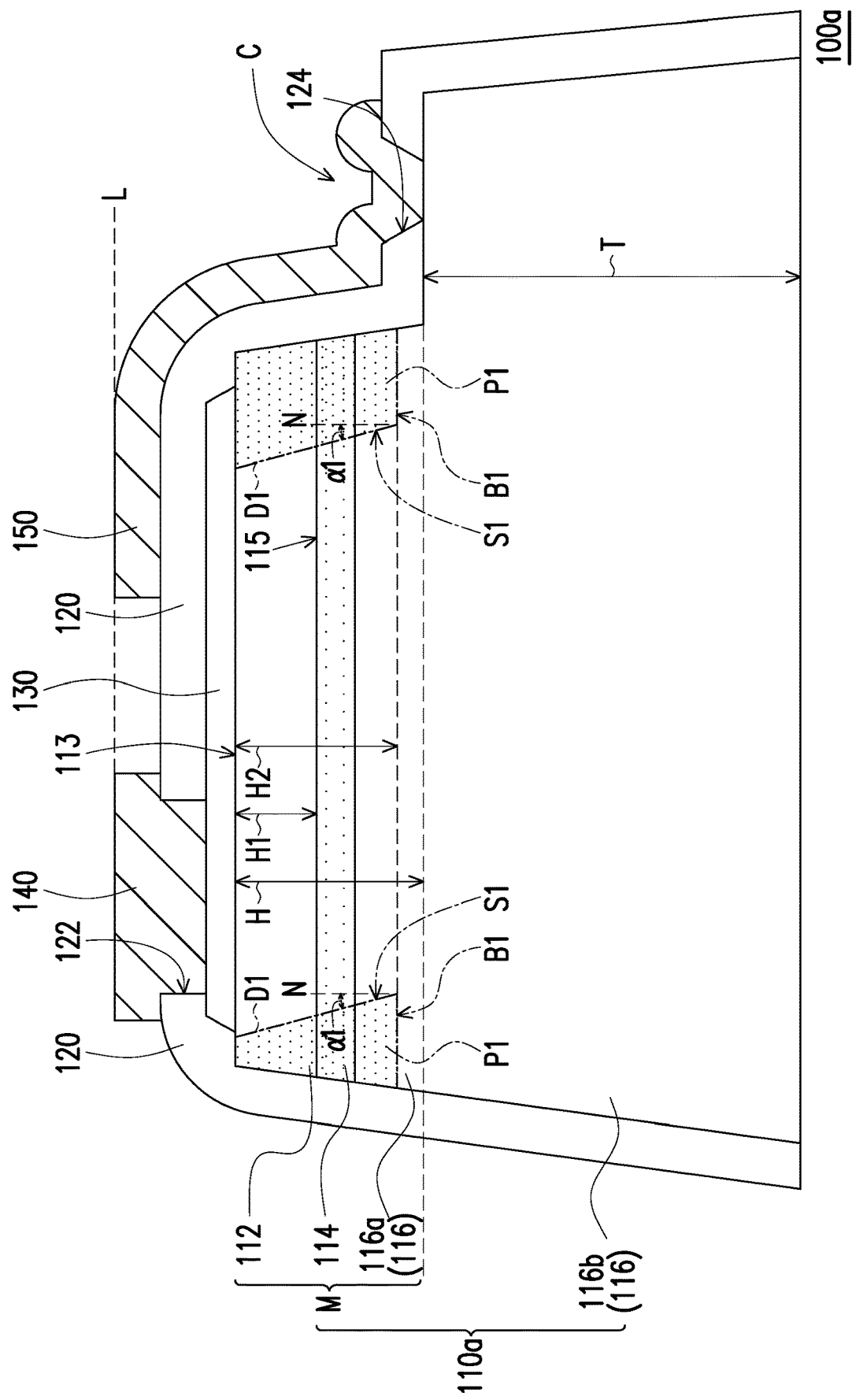
FIG. 1 is a schematic cross-sectional view of a micro light-emitting diode according to an embodiment of the disclosure.

FIG. 1 is a schematic cross-sectional view of a micro light-emitting diode according to an embodiment of the disclosure. With reference to FIG. 1, in this embodiment, a micro light-emitting diode 100*a* includes an epitaxial structure 110*a* and an insulating layer 120. The epitaxial structure 110*a* includes a first type semiconductor layer 112, a light-emitting layer 114, and a second type semiconductor layer 116, and has a first ion implantation region P1. The light-emitting layer 114 is located between the first type semiconductor layer 112 and the second type semiconductor layer 116. The second type semiconductor layer 116 has a first portion 116*a* and a second portion 116*b* connected to each other. The first portion 116*a* protrudes from second portion 116*b* and is located between the light-emitting layer 114 and the second portion 116*b*. The first type semiconductor layer 112, the light-emitting layer 114, and the first portion 116*a* of the second type semiconductor layer 116 constitute a mesa M. In other words, the second portion 116*b* of the second type semiconductor layer 116 forms a concavity C relative to the mesa M. The first ion implantation region P1 has a first inner side S1 and a first bottom side B1 connected to the first inner side S1. A first distance H1, that is, a thickness of the first type semiconductor layer 112, is present between a surface 113 of the first type semiconductor layer 112 and a top surface 115 of the light-emitting layer 114 adjacent to the surface 113. A second distance H2, that is, a depth of the first ion implantation region P1, is present between the surface 113 of the first type semiconductor layer 112 and the first bottom side B1 of the first ion implantation region P1. The second distance H2 is greater than the first distance H1 and less than a height H of the mesa M. In other words, calculated from the surface 113 of the first type semiconductor layer 112, the depth of the first ion implantation region P1 exceeds a depth of the light-emitting layer 114, but the depth of the first ion implantation region P1 is less than the height H of the mesa M. If the height H of the mesa M is less than the depth of the first ion implantation region P1, is likely to cause a substantial increase in the contact resistance of the second type semiconductor layer 116.

Moreover, a first included angle $\alpha 1$ is present between a first extension direction D1 of the first inner side S1 of the first ion implantation region P1 and a normal direction N of the light-emitting layer 114. An absolute value of the first included angle $\alpha 1$ is between 0 degree and 15 degrees. In other words, the first ion implantation region P1 has an ion implantation angle whose absolute value is between 0 degree and 15 degrees, and may be implanted in a manner from the upper left to the lower right or from the upper right to the lower left, which is not limited herein. The insulating layer 120 is disposed on the epitaxial structure 110a and covers part of the surface and side surfaces of the epitaxial structure 110a. To be more specific, the insulating layer 120 covers a periphery and part of the surface 113 of the first type semiconductor layer 112, a periphery of the light-emitting layer 114, and part of a periphery of the second type semiconductor layer 116. Here, the periphery of the first type semiconductor layer 112, the periphery of the light-emitting layer 114, and part of the periphery of the second type semiconductor layer 116 are in direct contact with the insulating layer 120. The insulating layer 120 is in contact with and covers a sidewall of the mesa M. The mesa M is closely adjacent to the second portion 116b.

Specifically, in this embodiment, the first type semiconductor layer 112 is a P-type semiconductor layer, the light-emitting layer 114 is a multi-quantum well (MWQ) structure, and the second type semiconductor layer 116 is an N-type semiconductor layer, for example but not limited thereto. The first bottom side B1 of the first ion implantation region P1 is embodied to be located in the first portion 116a of the second type semiconductor layer 116, that is, exceeding the depth of the light-emitting layer 114, and the absolute value of the first included angle $\alpha 1$ is preferably between 7 degrees and 15 degrees, which effectively prevents generation of the channel effects. Here, the ion implantation is performed in an implantation direction from the upper left to the lower right, so the first included angle $\alpha 1$ is between minus 7 degrees and minus 15 degrees, and the shape of the first ion implantation region P1 is a trapezoid, for example but not limited thereto. The first ion implantation region P1 surrounds the periphery of the first type semiconductor layer 112, the periphery of the light-emitting layer 114, and part of a periphery of the first portion 116a. A side of the first ion implantation region P1 opposite to the first inner side S1 is in direct contact with the insulating layer 120. Moreover, the first inner sides S1 of the first ion implantation regions P1 are arranged in parallel in a cross-sectional view. Nonetheless, the disclosure not limited thereto. For example, the height H of the mesa M is 1 μm to 1.5 μm, a height T of the concavity C is 1 μm to 3 μm, and the second distance H2 is greater than 0.7 μm and less than 1 μm.

Furthermore, the micro light-emitting diode 100a of this embodiment further includes a current distribution layer 130. The current distribution layer 130 is disposed between the insulating layer 120 and the first type semiconductor layer 112, and forms an ohmic contact together with the first type semiconductor layer 112. As shown in FIG. 1, an orthographic projection of the current distribution layer 130 on the surface 113 of the first type semiconductor layer 112 is smaller than the surface 113, further limiting the carriers flowing toward the sides of the micro light-emitting diode 100a, and reducing the current generated at the sides of the micro light-emitting diode 100a. Due to the relatively small area of the micro light-emitting diode 100a, the lateral leakage current may be reduced through the indented design of the current distribution layer 130 to improve the injection efficiency of holes and the current distribution. Here, the material of the current distribution layer 130 is, for example, indium tin oxide, indium oxide, tin oxide, aluminum zinc oxide, cadmium tin oxide, antimony tin oxide, zinc oxide, or a combination thereof.

In addition, the insulating layer 120 of this embodiment has a first opening 122 and a second opening 124. The first opening 122 exposes part of the current distribution layer 130, and the second opening 124 exposes part of the second portion 116b of the second type semiconductor layer 116. The first opening 122 is located at the mesa M, and the second opening 124 is located at the concavity C. The micro light-emitting diode 100a further includes a first electrode 140 and a second electrode 150. The first electrode 140 is disposed in the first opening 122 of the insulating layer 120 and extends onto the insulating layer 120. The first electrode 140 is electrically connected to the first type semiconductor layer 112. The second electrode 150 is disposed on the insulating layer 120, extends into the second opening 124, and is electrically connected to the second type semiconductor layer 116. Here, the first electrode 140 and part of the second electrode 150 are located on a same plane L, which helps to improve the yield of subsequent die bonding. Since the first electrode 140 and the second electrode 150 of this embodiment are located on the same side of the epitaxial structure 110a, the micro light-emitting diode 100a of this embodiment is embodied as a flip-chip type micro light-emitting diode.

In brief, ion implantation is employed in this embodiment for semiconductor layers (e.g., the first type semiconductor layer 112 and the second type semiconductor layer 116) to have properties similar to those of an intrinsic semiconductor, and to be implanted into the first portion 116a of the second type semiconductor layer 116 at an implantation angle having an absolute value between 0 degree and 15 degrees and at a depth exceeding the light-emitting layer 114. This design reduces the non-radiative recombination of electrons and holes close to a sidewall of the light-emitting layer 114, increases the external quantum efficiency, and effectively improves the dangling bond on the sidewall caused by dry etching, thus increasing the luminous efficiency of the micro light-emitting diode 100a of this embodiment.

It should be noted here that the reference numerals and part of the contents of the embodiments above remain to be used in the following embodiments, where the same reference numerals are used to denote the same or similar elements, and the description of the same technical content is omitted. Reference may be made to the embodiments above for the description of the omitted parts, which will not be repeated in the following embodiments.

Figure 2:
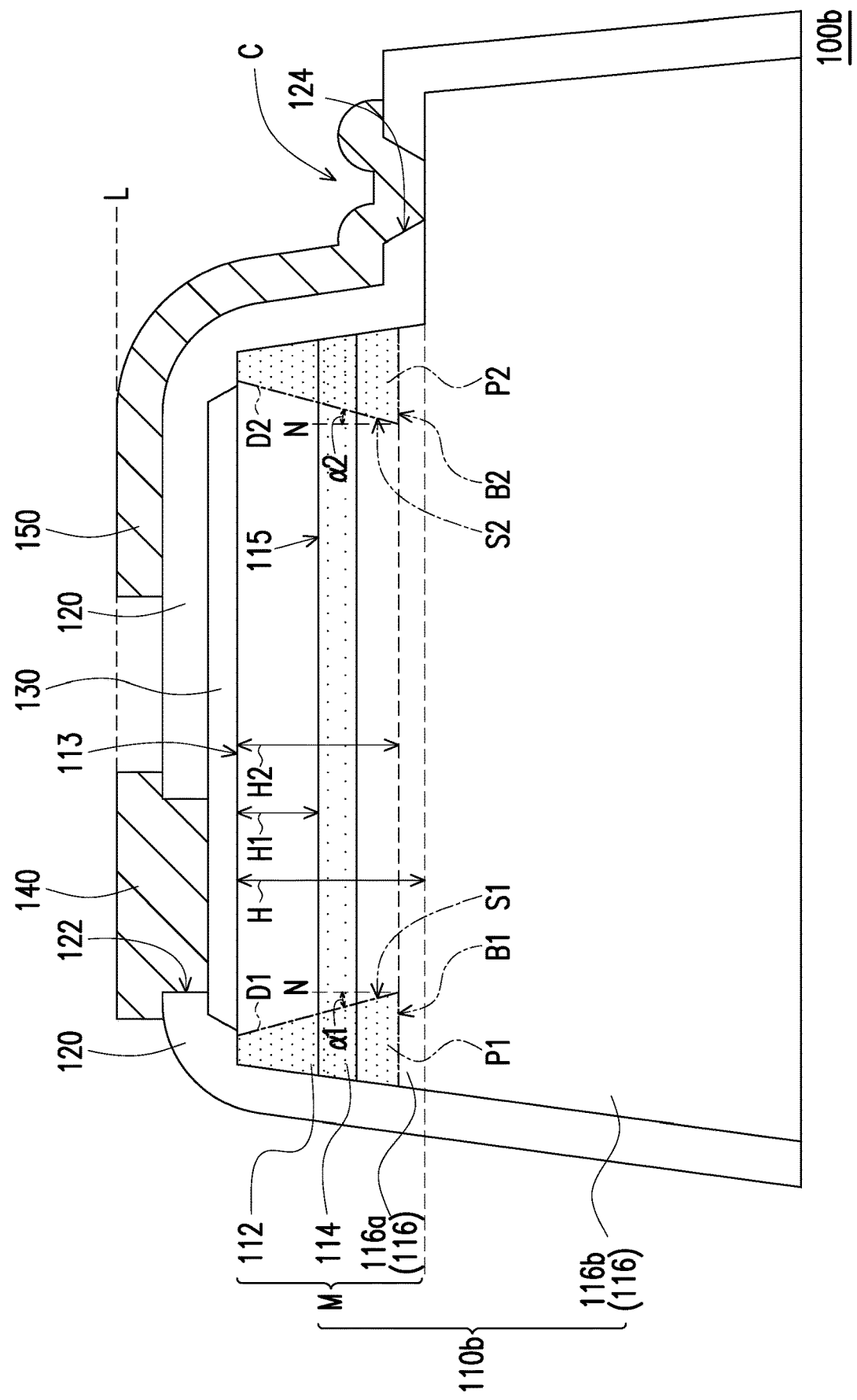
FIG. 2 is a schematic cross-sectional view of a micro light-emitting diode according to another embodiment of the disclosure.

FIG. 2 is a schematic cross-sectional view of a micro light-emitting diode according to another embodiment of the disclosure. With reference to FIG. 1 and FIG. 2 together, a micro light-emitting diode 100b of this embodiment is similar to the micro light-emitting diode 100a of FIG. 1, and their differences are: in this embodiment, the shape of a first ion implantation region P2 on the right and the shape of the first ion implantation region P1 on the left of an epitaxial structure 110b exhibit a mirror pattern in a cross-sectional view, and the first ion implantation regions P1, P2 surround the periphery of the first type semiconductor layer 112, the periphery of the light-emitting layer 114, and part of the periphery of the first portion 116a.

To be specific, the first ion implantation region P2 on the right has a first inner side S2 and a first bottom side B2 connected to the first inner side S2 in a cross-sectional view. A first included angle α2 is present between a first extension direction D2 of the first inner side S2 of the first ion implantation region P2 and the normal direction N of the light-emitting layer 114. An absolute value of the first included angle α2 is preferably between 0 degree and 15 degrees. More specifically, the first inner side S1 of the first ion implantation region P1 on the left is disposed on the first portion 116a of the second type semiconductor layer 116 as an inclined surface from the upper left to the lower right. The first included angle α1 is minus 7 degrees to minus 15 degrees Spend. The first inner side S2 the first ion implantation region P2 on the right is disposed on the first portion 116a of the second type semiconductor layer 116 as an inclined surface from the upper right to the lower left. The first included angle α2 is preferably plus 7 degrees to plus 15 degrees. At this time, the absolute values of the first included angle α1 and the first included angle α2 are still between 0 degree and 15 degrees. Here, the first inner side S1 of the first ion implantation region P1 and the first inner side S2 of the first ion implantation region P2 are not parallel and are arranged as mirror images.

Figure 3:
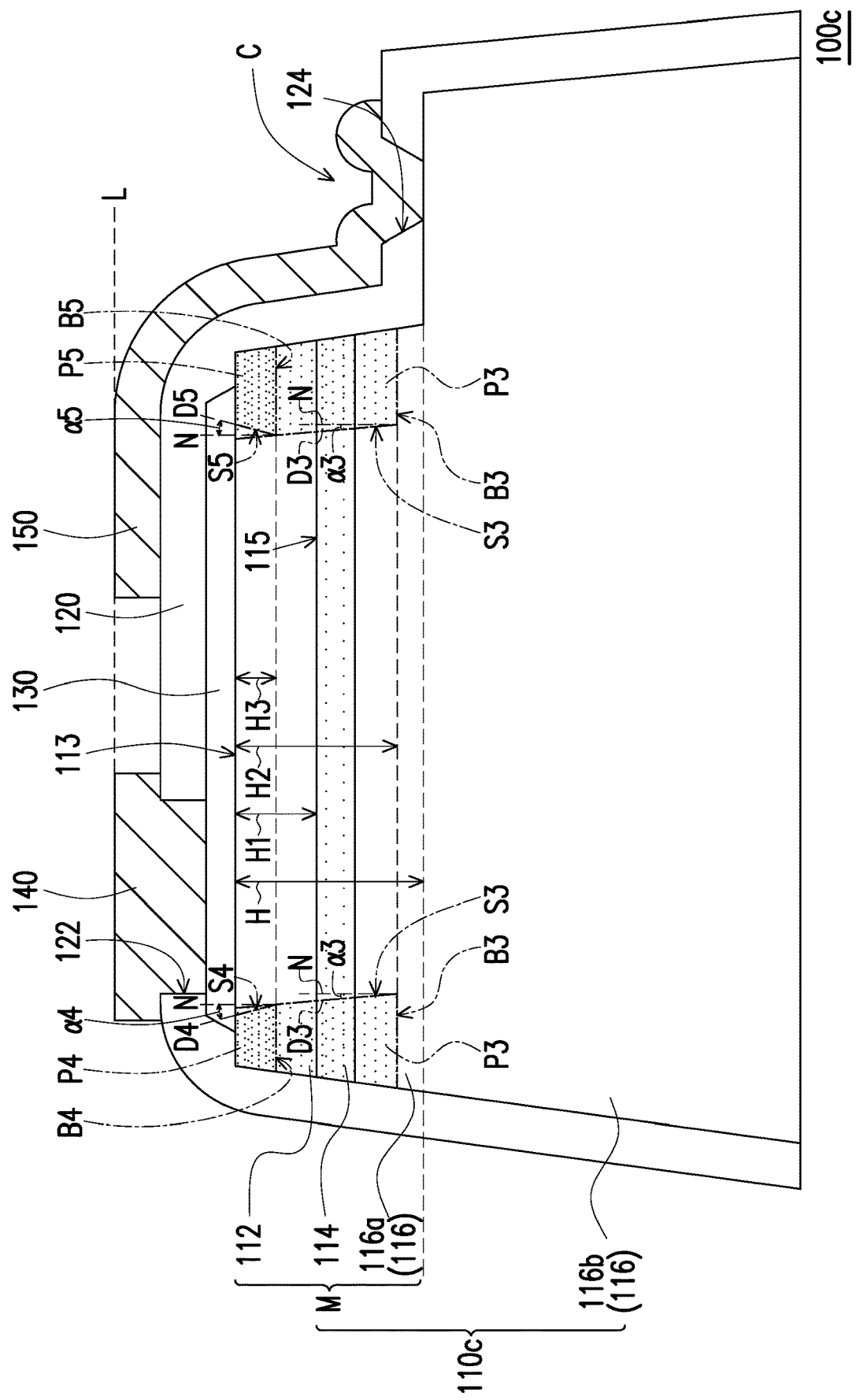
FIG. 3 is a schematic cross-sectional view of a micro light-emitting diode according to yet another embodiment of the disclosure.

FIG. 3 is a schematic cross-sectional view of a micro light-emitting diode according to yet another embodiment of the disclosure. With reference to FIG. 1 and FIG. 3 together, a micro light-emitting diode 100c of this embodiment is similar to the micro light-emitting diode 100a of FIG. 1, and their differences are: in this embodiment, the angle of a first included angle α3 of a first ion implantation region P3 is different from the angle of the first included angle α1 of the first ion implantation region P1 in a cross-sectional view, and an epitaxial structure 110c further has second ion implantation regions P4, P5. Here, the first ion is different from the second ion. For example, the first ion is krypton, argon, or arsenic, and second ion is phosphorus or arsenic.

To be specific, the first ion implantation region P3 has a first inner side S3 and a first bottom side B3 connected to the first inner side S3. The first included angle α3 is present between a first extension direction D3 of the first inner side S3 of the first ion implantation region P3 and the normal direction N of the light-emitting layer 114. An absolute value of the first included angle α3 is preferably between 0 degree and 5 degrees. Here, the first ion implantation region P3 is implanted into the first portion 116a of the second type semiconductor layer 116 in an implantation direction from the upper left to the lower right. The first included angle α3 is 0 degree to minus 5 degrees.

Furthermore, the second ion implantation region P4 on the left and the second ion implantation region P5 on the right respectively have second inner sides S4, S5 and second bottom sides B4, B5 connected to the second inner sides S4, S5 in a cross-sectional view. A third distance H3 (i.e., a depth of the second ion implantation regions P4, P5) is present between the surface 113 of the first type semiconductor layer 112 and the second bottom sides B4, B5 of the second ion implantation regions P4, P5. The third distance H3 is less than the first distance H1. Here, the second bottom sides B4, B5 of the second ion implantation regions P4, P5 are located in the first type semiconductor layer 112 and surround the periphery of the first type semiconductor layer 112. In other words, the depth of the second ion implantation regions P4, P5 does not exceed the depth of the light-emitting layer 114. As shown in FIG. 3, second included angles α4, α5 are present between second extension directions D4, D5 of the second inner sides S4, S5 of the second ion implantation regions P4, P5 and the normal direction N of the light-emitting layer 114. Absolute values of the second included angles α4, α5 are preferably between 7 degrees and 15 degrees.

More specifically, the second ion implantation region P4 on the left is implanted into the first type semiconductor layer 112 in an implantation direction from the upper left to the lower right in a cross-sectional view. The second included angle α4 is minus 7 degrees to minus 15 degrees. The second ion implantation region P5 on the right is implanted into the first type semiconductor layer 112 in an implantation direction from the upper right to the lower left. The second included angle α5 is plus 7 degrees to plus 15 degrees. Particularly, an ion concentration of the second ion implantation regions P4, P5 is greater than an ion concentration of the first ion implantation region P3. In other words, for a great implantation angle, the depth is shallower (i.e., not exceeding the light-emitting layer 114), and for a small implantation angle, the depth is deeper (i.e., exceeding the light-emitting layer 114, but not exceeding the height H of the mesa M). Here, part regions of the first ion implantation region P3 are overlapped with the second ion implantation regions P4, P5.

In brief, in this embodiment, high-resistance regions (i.e., the second ion implantation regions P4, P5) are first formed in the first type semiconductor layer 112 to reduce the generation and passage of carriers; after that, the first ion implantation region P3 is formed on the first portion 116a of the second type semiconductor layer 116 to destroy the electron-hole recombination at the edge of the light-emitting layer 114, achieving a sufficiently great resistance value while causing little damage to the surface.

Figure 4:
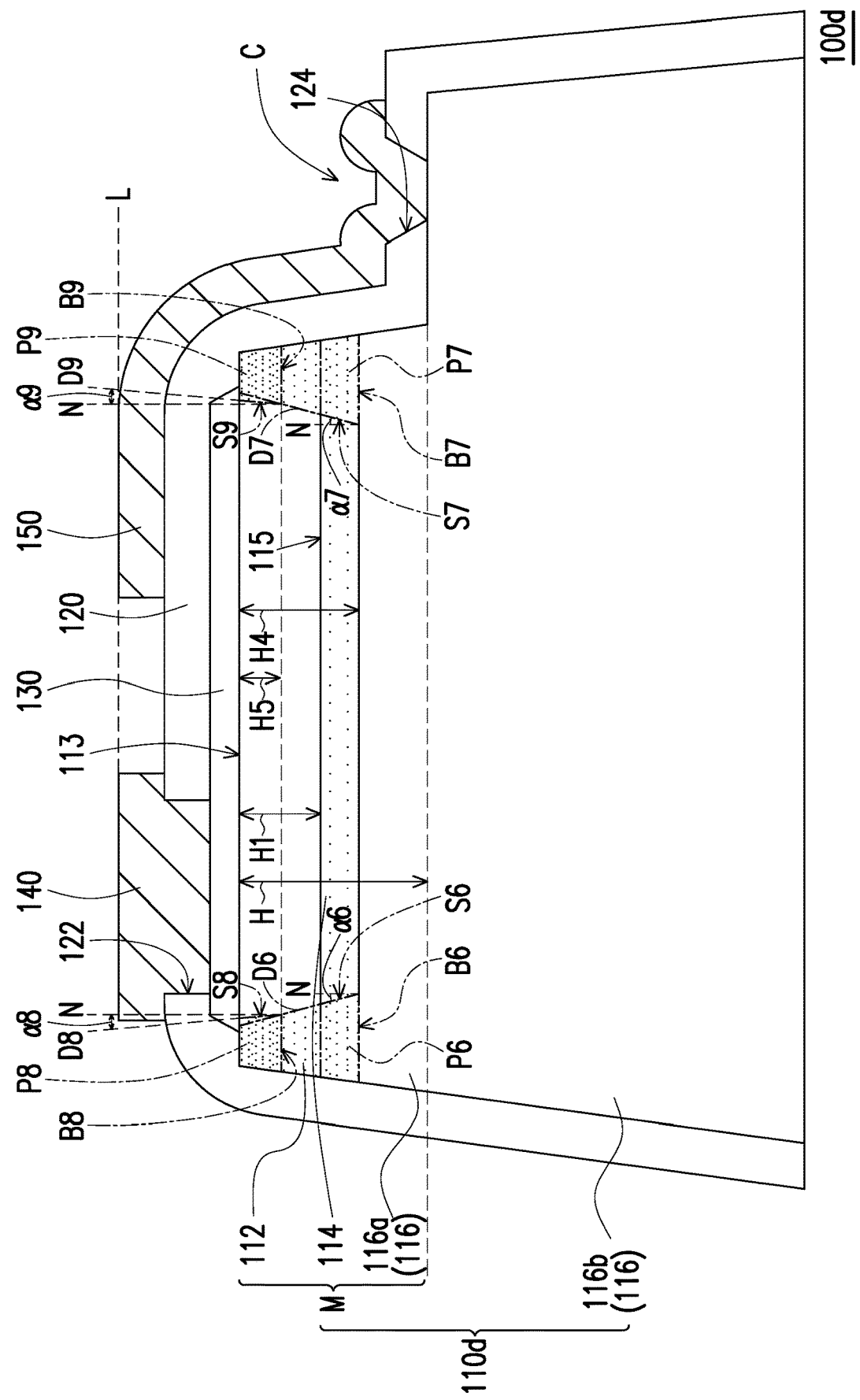
FIG. 4 is a schematic cross-sectional view of a micro light-emitting diode according to still another embodiment of the disclosure.

FIG. 4 is a schematic cross-sectional view of a micro light-emitting diode according to still another embodiment of the disclosure. With reference to FIG. 1 and FIG. 4 together, a micro light-emitting diode 100d of this embodiment is similar to the micro light-emitting diode 100a of FIG. 1, and their differences are: in this embodiment, the shapes of first ion implantation regions P6, P7 are different from the shape of the first ion implantation region P1 in a cross-sectional view, and an epitaxial structure 110d further has second ion implantation regions P8, P9.

To be specific, the first ion implantation regions P6, P7 have first inner sides S6, S7 and first bottom sides B6, B7 connected to the first inner sides S6, S7 in a cross-sectional view. First included angles α6, α7 are present between first extension directions D6, D7 of the first inner sides S6, S7 of the first ion implantation regions P6, P7 and the normal direction N of the light-emitting layer 114. Absolute values of the first included angles α6, α7 are preferably between 7 degrees and 15 degrees. The first bottom sides B6, B7 of the first ion implantation regions P6, P7 are located in the light-emitting layer 114. The first ion implantation regions P6, P7 surround the periphery of the first type semiconductor layer 112 and the periphery of the light-emitting layer 114. Here, the first ion implantation region P6 on the left is implanted into the light-emitting layer 114 in an implantation direction from the upper left to the lower right. The first included angle α6 is minus 7 degrees to minus 15 degrees. The first ion implantation region P7 on the right is implanted into the light-emitting layer 114 in an implantation direction from the upper right to the lower left. The first included angle α7 is plus 7 degrees to plus 15 degrees. A second distance H4 is present between the surface 113 of the first type semiconductor layer 112 and the first bottom sides B6, B7 of the first ion implantation regions P6, P7. The second distance H4 is greater than the first distance H1 and less than the height H of the mesa M.

Furthermore, the second ion implantation regions P8, P9 have second inner sides S8, S9 and second bottom sides B8, B9 connected to the second inner sides S8, S9. A third distance H5 is present between the surface 113 of the first type semiconductor layer 112 and the second bottom sides B8, B9 of the second ion implantation regions P8, P9. The third distance H5 is less than the first distance H1. More specifically, the second bottom sides B8, B9 of the second ion implantation regions P8, P9 are located in the first type semiconductor layer 112. The second ion implantation regions P8, P9 surround part of the periphery of the first type semiconductor layer 112. Second included angles α8, α9 are present between second extension directions D8, D9 of the second inner sides S8, S9 of the second ion implantation regions P8, P9 and the normal direction N of the light-emitting layer 114. Absolute values of the second included angles α8, α9 are preferably between 0 degree and 5 degrees. Here, the second ion implantation region P8 on the left is implanted into the first type semiconductor layer 112 in an implantation direction from the upper left to the lower right. The second included angle α8 is 0 degree to minus 5 degrees. The second ion implantation region P9 on the right is implanted into the first type semiconductor layer 112 in an implantation direction from the upper right to the lower left. The second included angle α9 is 0 degree to plus 5 degrees. Particularly, an ion concentration of the second ion implantation regions P8, P9 is greater than an ion concentration of the first ion implantation regions P6, P7. In other words, for a large implantation angle, the depth is deeper (i.e., exceeding the light-emitting layer 114, but not exceeding the height H of the mesa M); for a small implantation angle, the depth is shallower (i.e., not exceeding the light-emitting layer 114). Here, a partial region of the first ion implantation region P6 on the left is overlapped with the second ion implantation region P8 on the left, and a partial region of the first ion implantation region P7 on the right is overlapped with the second ion implantation region P9 on the right.

In brief, in this embodiment, high-resistance regions (i.e., the second ion implantation regions P8, P9) are first formed in the first type semiconductor layer 112 to reduce the generation and passage of carriers; after that, the first ion implantation regions P6, P7 are formed on the light-emitting layer 114 to destroy the electron-hole recombination at the edge of the light-emitting layer 114, achieving a sufficiently great resistance value while causing little damage to the surface.

Figure 5:
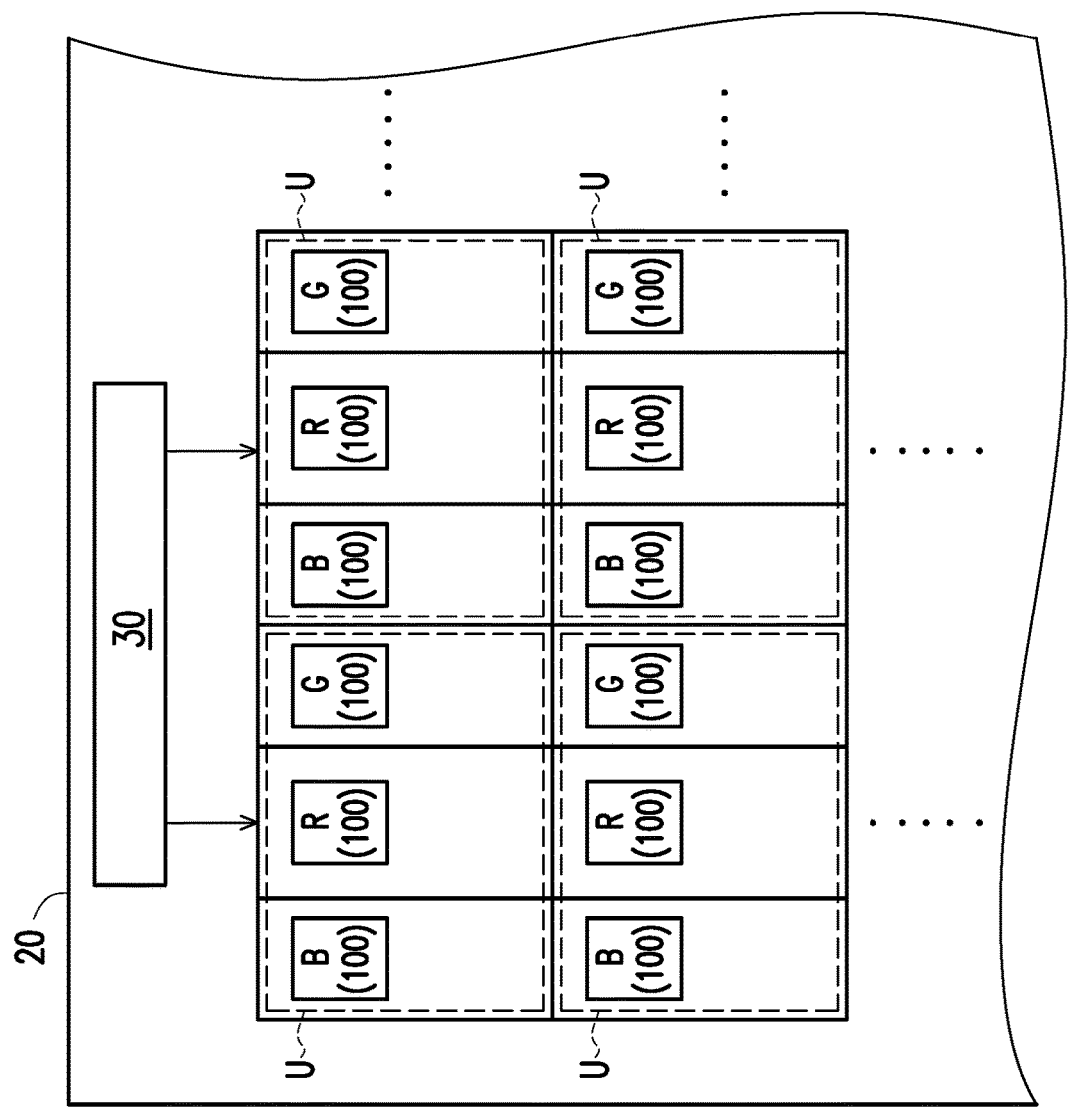
FIG. 5 is a schematic partial top view of a micro light-emitting diode display panel according to an embodiment of the disclosure.

FIG. 5 is a schematic partial top view of a micro light-emitting diode display panel according to an embodiment of the disclosure. With reference to FIG. 5, in this embodiment, a micro light-emitting diode display panel 10 includes a substrate 20 and a plurality of micro light-emitting diodes 100 described above. The micro light-emitting diodes 100 are selected from the micro light-emitting diodes 100a, 100b, 100c, and 100d in the embodiments above. Preferably, the micro light-emitting diodes 100 include a red micro light-emitting diode R emitting red light, a green micro light-emitting diode G emitting green light, and a blue micro light-emitting diode B emitting blue light. To be specific, the substrate 20 includes a controlling element 30 and a plurality of pixels U. The micro light-emitting diodes 100 are arranged into an array on the substrate 20 to form the pixels U and are electrically connected to the controlling element 30. The controlling element 30 respectively controls the micro light-emitting diodes 100 to emit light to form a display screen.

In summary of the foregoing, in the design of the micro light-emitting diode of the disclosure, the epitaxial structure has the first ion implantation region. The second distance between the surface of the first type semiconductor layer and the first bottom side of the first ion implantation region is greater than the first distance between the surface of the first type semiconductor layer and the top surface of the light-emitting layer adjacent to the surface and less than the height of the mesa. In addition, the first included angle having an absolute value between 0 degree and 15 degrees is present between the first extension direction of the first inner side of the first ion implantation region and the normal direction of the light-emitting layer. In other words, in the disclosure, the depth of the first ion implantation region exceeds the depth of the light-emitting layer, and the absolute value of the implantation angle of the first ion implantation region is between 0 degree and 15 degrees. This design reduces a substantial decrease in the external quantum efficiency caused by non-radiative recombination at the sidewall of the micro light-emitting diode, increases the external quantum efficiency, and effectively improves the dangling bond on the sidewall caused by dry etching, thus increasing the luminous efficiency of the micro light-emitting diode of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light-emitting diode, comprising:
an epitaxial structure comprising a first type semiconductor layer, a light-emitting layer, and a second type semiconductor layer, and having a first ion implantation region, wherein the light-emitting layer is located between the first type semiconductor layer and the second type semiconductor layer, the first type semiconductor layer, the light-emitting layer, and a first portion of the second type semiconductor layer constitute a mesa, a second portion of the second type semiconductor layer forms a concavity relative to the mesa, the first ion implantation region has a first inner side and a first bottom side connected to the first inner side, a first distance is present between a surface of the first type semiconductor layer and a top surface of the light-emitting layer adjacent to the surface, a second distance is present between the surface of the first type semiconductor layer and the first bottom side of the first ion implantation region, the second distance is greater than the first distance and less than a height of the mesa, a first included angle is present between a first extension direction of the first inner side of the first ion implantation region and a normal direction of the light-emitting layer, and an absolute value of the first included angle is between 0 degree and 15 degrees; and an insulating layer disposed on the epitaxial structure and covering a periphery of the first type semiconductor layer and part of the surface, a periphery of the light-emitting layer, and part of a periphery of the second type semiconductor layer.

2. The micro light-emitting diode according to claim 1, wherein the insulating layer is in contact with and covers a sidewall of the mesa, and the mesa is closely adjacent to the second portion.

3. The micro light-emitting diode according to claim 1, further comprising:

a current distribution layer disposed between the insulating layer and the first type semiconductor layer, wherein an orthographic projection of the current distribution layer on the surface of the first type semiconductor layer is smaller than the surface.

4. The micro light-emitting diode according to claim 3, wherein a material of the current distribution layer comprises indium tin oxide, indium oxide, tin oxide, aluminum zinc oxide, cadmium tin oxide, antimony tin oxide, zinc oxide, or a combination thereof.

5. The micro light-emitting diode according to claim 1, further comprising:

a first electrode electrically connected to the first type semiconductor layer; and a second electrode electrically connected to the second type semiconductor layer, wherein the first electrode and part of the second electrode are located on a same plane.

6. The micro light-emitting diode according to claim 5, further comprising:

a current distribution layer disposed between the insulating layer and the first type semiconductor layer, wherein an orthographic projection of the current distribution layer on the surface of the first type semiconductor layer is smaller than the surface, the insulating layer has a first opening exposing the current distribution layer and a second opening exposing the second portion of the second type semiconductor layer, the first opening is located at the mesa, and the second opening is located at the concavity, the first electrode is disposed in the first opening and extends onto the insulating layer, and the second electrode is disposed on the insulating layer and extends into the second opening.

7. The micro light-emitting diode according to claim 1, wherein the first bottom side of the first ion implantation region is located in the first portion of the second type semiconductor layer, and the first ion implantation region surrounds the periphery of the first type semiconductor layer, the periphery of the light-emitting layer, and part of a periphery of the first portion.

8. The micro light-emitting diode according to claim 1, wherein the absolute value of the first included angle is between 7 degrees and 15 degrees.

9. The micro light-emitting diode according to claim 1, wherein the epitaxial structure further has a second ion implantation region, the second ion implantation region has a second inner side and a second bottom side connected to the second inner side, a third distance is present between the surface of the first type semiconductor layer and the second bottom side of the second ion implantation region, and the third distance is less than the first distance.

10. The micro light-emitting diode according to claim 9, wherein the second bottom side of the second ion implantation region is located in the first type semiconductor layer and surrounds part of the periphery of the first type semiconductor layer, a second included angle is present between a second extension direction of the second inner side of the second ion implantation region and the normal direction of the light-emitting layer, and an absolute value of the second included angle is greater than the absolute value of the first included angle.

11. The micro light-emitting diode according to claim 10, wherein an ion concentration of the second ion implantation region is greater than an ion concentration of the first ion implantation region.

12. The micro light-emitting diode according to claim 1, wherein the first bottom side of the first ion implantation region is located in the light-emitting layer, and the first ion implantation region surrounds the periphery of the first type semiconductor layer and the periphery of the light-emitting layer.

13. The micro light-emitting diode according to claim 1, wherein the periphery of the light-emitting layer is in direct contact with the insulating layer.

14. A micro light-emitting diode display panel, comprising:

a substrate having a controlling element; and a plurality of micro light-emitting diodes arranged into an array on the substrate to form a plurality of pixels and being electrically connected to the controlling element, wherein the controlling element respectively controls the plurality of micro light-emitting diodes to emit light, and each of the plurality of micro light-emitting diodes comprises:

an epitaxial structure comprising a first type semiconductor layer, a light-emitting layer, and a second type semiconductor layer, and having a first ion implantation region, wherein the light-emitting layer is located between the first type semiconductor layer and the second type semiconductor layer, the first type semiconductor layer, the light-emitting layer, and a first portion of the second type semiconductor layer constitute a mesa, a second portion of the second type semiconductor layer forms a concavity relative to the mesa, the first ion implantation region has a first inner side and a first bottom side connected to the first inner side, a first distance is present between a surface of the first type semiconductor layer and a top surface of the light-emitting layer adjacent to the surface, a second distance is present between the surface of the first type semiconductor layer and the first bottom side of the first ion implantation region, the second distance is greater than the first distance and less than a height of the mesa, a first included angle is present between a first extension direction of the first inner side of the first ion implantation region and a normal direction of the light-emitting layer, and an absolute value of the first included angle is between 0 degree and 15 degrees; and an insulating layer disposed on the epitaxial structure and covering a periphery of the first type semiconductor layer and part of the surface, a periphery of the light-emitting layer, and part of a periphery of the second type semiconductor layer.

15. The micro light-emitting diode display panel according to claim 14, wherein the plurality of micro light-emitting diodes comprises a red micro light-emitting diode emitting red light, a green micro light-emitting diode emitting green light, and a blue micro light-emitting diode emitting blue light.

* * * * *